(12) United States Patent
Ahn

(10) Patent No.: US 9,535,452 B2
(45) Date of Patent: Jan. 3, 2017

(54) FOLDABLE DISPLAY DEVICE

(71) Applicant: SAMSUNG DISPLAY CO., LTD., Yongin-si, Gyeonggi-do (KR)

(72) Inventor: Sung Sang Ahn, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/831,799

(22) Filed: Aug. 20, 2015

(65) Prior Publication Data

US 2016/0295709 A1    Oct. 6, 2016

(30) Foreign Application Priority Data

Apr. 1, 2015 (KR) .................. 10-2015-0045982

(51) Int. Cl.
*G06F 1/16* (2006.01)
*H05K 5/00* (2006.01)
*H05K 5/02* (2006.01)
*H05K 1/02* (2006.01)

(52) U.S. Cl.
CPC ........... *G06F 1/1616* (2013.01); *G06F 1/1615* (2013.01); *G06F 1/1652* (2013.01); *G06F 1/1681* (2013.01); *H05K 1/028* (2013.01); *H05K 5/0017* (2013.01); *H05K 5/0226* (2013.01)

(58) Field of Classification Search
CPC .... G06F 1/1615; G06F 1/1616; G06F 1/1618; G06F 1/1624; G06F 1/1652; G06F 1/1681; H04M 1/0206; H05K 5/0017; H05K 1/028; H05K 5/0226

USPC .............. 361/679.01–679.3, 679.55–679.59, 361/679.41–679.5; 345/1.1, 1.3
See application file for complete search history.

(56) References Cited

U.S. PATENT DOCUMENTS

| | | | |
|---|---|---|---|
| 8,971,031 B2 * | 3/2015 | Mok | G06F 1/1652 349/58 |
| 9,173,288 B1 * | 10/2015 | Kim | G06F 1/1633 |
| 2007/0164923 A1 * | 7/2007 | Kanai | G06F 1/1616 345/1.1 |
| 2012/0044620 A1 * | 2/2012 | Song | G06F 1/1616 361/679.01 |
| 2012/0204453 A1 | 8/2012 | Jung | |

(Continued)

FOREIGN PATENT DOCUMENTS

| KR | 20090105146 A | * | 10/2009 | ........... G06F 1/1616 |
|---|---|---|---|---|
| KR | 10-1051412 B1 | | 7/2011 | |

(Continued)

*Primary Examiner* — Nidhi Thaker
(74) *Attorney, Agent, or Firm* — Lewis Roca Rothgerber Christie LLP

(57) ABSTRACT

A foldable display device includes a flexible display panel including a bendable area and flat areas on both sides of the bendable area, and a lower case housing the flexible display panel and including a hinge corresponding to the bendable area and including a first rotation point connected to a first link having a first radius of rotation and a second rotation point connected to a second link having a second radius of rotation, the second radius of rotation being different from the first radius of rotation, and supports on both sides of the hinge and corresponding to the flat areas, wherein the first link has an end connected to the first rotation point and a first guide opening connected to each of the supports, and the second link has a first end connected to the second rotation point and a second end engaging the first guide opening.

20 Claims, 5 Drawing Sheets

(56) References Cited

U.S. PATENT DOCUMENTS

| | | | | |
|---|---|---|---|---|
| 2012/0307472 A1* | 12/2012 | Bohn | ............... | G06F 1/1616 |
| | | | | 361/807 |
| 2013/0021762 A1* | 1/2013 | van Dijk | ............... | G06F 1/1652 |
| | | | | 361/749 |
| 2013/0342090 A1* | 12/2013 | Ahn | ............... | G09F 9/33 |
| | | | | 312/258 |
| 2013/0342094 A1 | 12/2013 | Walters et al. | | |
| 2014/0111954 A1* | 4/2014 | Lee | ............... | G06F 1/1641 |
| | | | | 361/749 |
| 2015/0373863 A1* | 12/2015 | Lin | ............... | A45C 11/00 |
| | | | | 206/774 |

FOREIGN PATENT DOCUMENTS

| | | |
|---|---|---|
| KR | 10-1107124 B1 | 1/2012 |
| KR | 10-2014-0050504 A | 4/2014 |
| WO | WO 2015116062 A1 * 8/2015 | ........... G06F 1/1616 |

* cited by examiner

FOLDABLE DISPLAY DEVICE

CROSS-REFERENCE TO RELATED APPLICATION

This application claims priority to and the benefit of Korean Patent Application No. 10-2015-0045982, filed on Apr. 1, 2015 in the Korean Intellectual Property Office, the disclosure of which is incorporated herein by reference in its entirety.

BACKGROUND

1. Field

The present invention relates to a foldable display device.

2. Description of the Related Art

A foldable display device uses a flexible display panel that may be bent. The foldable display device is easy to carry when folded and provides a large screen when unfolded. Therefore, the foldable display device may be applied in a variety of fields including mobile devices such as mobile phones, ultra-mobile PCs, electronic books and electronic newspapers but also televisions and monitors.

The foldable display device includes a case that supports the flexible display panel. The case is configured to support a lower surface of the flexible display panel, which has a bendable area between flat areas on both sides. For example, the case may include flat parts that correspond to the flat areas on both sides and a hinge (e.g., a hinge part), which are formed in the middle to correspond to the bendable area. The flexible display panel may be folded as the case is bent. Here, the inside of the bendable area is contracted by a compressive force, and the outside of the bendable area is stretched by a tensile force. However, because the flexible display panel is constrained by the support structure, stress generated by the compressive and tensile forces fails to be released. This stress may damage the flexible display panel, thereby reducing durability.

In addition, the hinge and the bendable area may interfere with each other at the initial stage of bending of the flexible display panel, and the interference may aggravate the stress of the bendable area.

SUMMARY

Aspects of the present invention are directed to a foldable display device that can suppress (e.g., reduce) the damage to a flexible display panel and increase durability by reducing bending stress of the flexible display panel.

However, aspects of the present invention are not restricted to those set forth herein. The above and other aspects of the present invention will become more apparent to one of ordinary skill in the art to which the present invention pertains by referencing the detailed description of the present invention given below.

According to an embodiment of the present invention, there is provided a foldable display device including: a flexible display panel including a bendable area and flat areas on both sides of the bendable area; and a lower case housing the flexible display panel and including: a hinge corresponding to the bendable area and including a first rotation point connected to a first link having a first radius of rotation and a second rotation point connected to a second link having a second radius of rotation, the second radius of rotation being different from the first radius of rotation; and supports on both sides of the hinge and corresponding to the flat areas, wherein the first link has an end connected to the first rotation point and a first guide opening connected to each of the supports, and the second link has a first end connected to the second rotation point and a second end engaging the first guide opening.

In an embodiment, each of the supports includes a support plate configured to support the flexible display panel, a bottom portion opposite the support plate, and sidewalls extending from both sides of the bottom portion and perpendicular to the support plate, and each of the sidewalls includes a second guide opening extending in a different direction from the first guide opening, and the second end of the second link engages the second guide opening.

In an embodiment, each of the sidewalls includes a first moving protrusion configured to move along the first guide opening, and the second end of the second link includes a second moving protrusion configured to move along the first guide opening and the second guide opening.

In an embodiment, at least part of the first guide opening includes a region extending in a first direction, and the second guide opening extends in a second direction orthogonal to the first direction.

In an embodiment, the first guide opening further includes a region sloping from an end of the region extending in the first direction toward a lower part of the hinge.

In an embodiment, each of the supports includes a support plate configured to support the flexible display panel, a bottom portion opposite the support plate, and sidewalls extending from both sides of the bottom portion and perpendicular to the support plate, and each of the sidewalls includes a second guide opening extending in a different direction from the first guide opening, the first link includes a third guide opening extending in a direction perpendicular to the second guide opening, and the second end of the second link engages the second guide opening.

In an embodiment, wherein the first guide opening is closer to the hinge than the third guide opening.

In an embodiment, each of the supports includes a support plate configured to support the flexible display panel, a bottom surface opposite the support plate, and sidewalls extending from both sides of a bottom portion and perpendicular to the support plate, wherein the first link extends in the same direction as the sidewalls, and a height of the first link is substantially equal to those of the sidewalls.

In an embodiment, the second link has a bent shape, and a height of the second rotation point along the second direction from a bottom of the hinge is greater than that of the first rotation point.

In an embodiment, the hinge includes a spindle configured to provide a rotational force to at least one of the first rotation point and the second rotation point, and an upper case coupled to the lower case to maintain a shape of the flexible display panel.

In an embodiment, a radius of rotation of the first rotation point is greater than that of the second rotation point.

According to an embodiment of the present invention, there is provided a foldable display device including: a flexible display panel including a bendable area and flat areas on both sides of the bendable area; supports under the flexible display panel and corresponding to the flat areas, the supports being configured to support the flexible display panel; and a hinge between the supports and configured to rotate each of the supports using a first link connected to a first rotation point and a second link connected to a second rotation point, the second rotation point being different from the first rotation point, wherein each of the supports includes a support plate contacting the flexible display panel and sidewalls perpendicular to the support plate, wherein the first link is connected to each of the sidewalls using a first guide opening including a region extending in a first direction in at least part thereof, each of the sidewalls includes a second guide opening extending in a second direction orthogonal to the first direction, and the second link is configured to move along the first guide opening and the second guide opening.

In an embodiment, each of the sidewalls includes a first moving protrusion configured to move along the first guide opening, and a second end of the second link includes a second moving protrusion configured to move along the first guide opening and the second guide opening.

In an embodiment, the first link further includes a third guide opening extending in the first direction, and each of the sidewalls further includes a third moving protrusion configured to move along the third guide opening.

In an embodiment, the first guide opening is closer to the hinge than the third guide opening.

In an embodiment, the first link extends in the same direction as the sidewalls, and a height of the first link is substantially equal to those of the sidewalls.

In an embodiment, the second link has a bent shape, and a height of the second rotation point along the second direction from a bottom of the hinge is greater than that of the first rotation point.

In an embodiment, the hinge includes a spindle configured to provide a rotational force to at least one of the first rotation point and the second rotation point, and an upper case coupled to a lower case to maintain a shape of the flexible display panel.

In an embodiment, a radius of rotation of the first rotation point is different from that of the second rotation point.

In an embodiment, the radius of rotation of the first rotation point is greater than that of the second rotation point.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

The aspects and features of the present invention and methods for achieving the aspects and features will be apparent by referring to the embodiments to be described in detail with reference to the accompanying drawings. However, the present invention is not limited to the embodiments disclosed hereinafter, but may be implemented in diverse forms. The matters defined in the description, such as the detailed construction and elements, are nothing but specific details provided to assist those of ordinary skill in the art in understanding the invention, and the present invention is defined within the scope of the appended claims, and their equivalents.

The present invention will now be described more fully with reference to the accompanying drawings, in which exemplary embodiments of the invention are shown.

Figure 1:
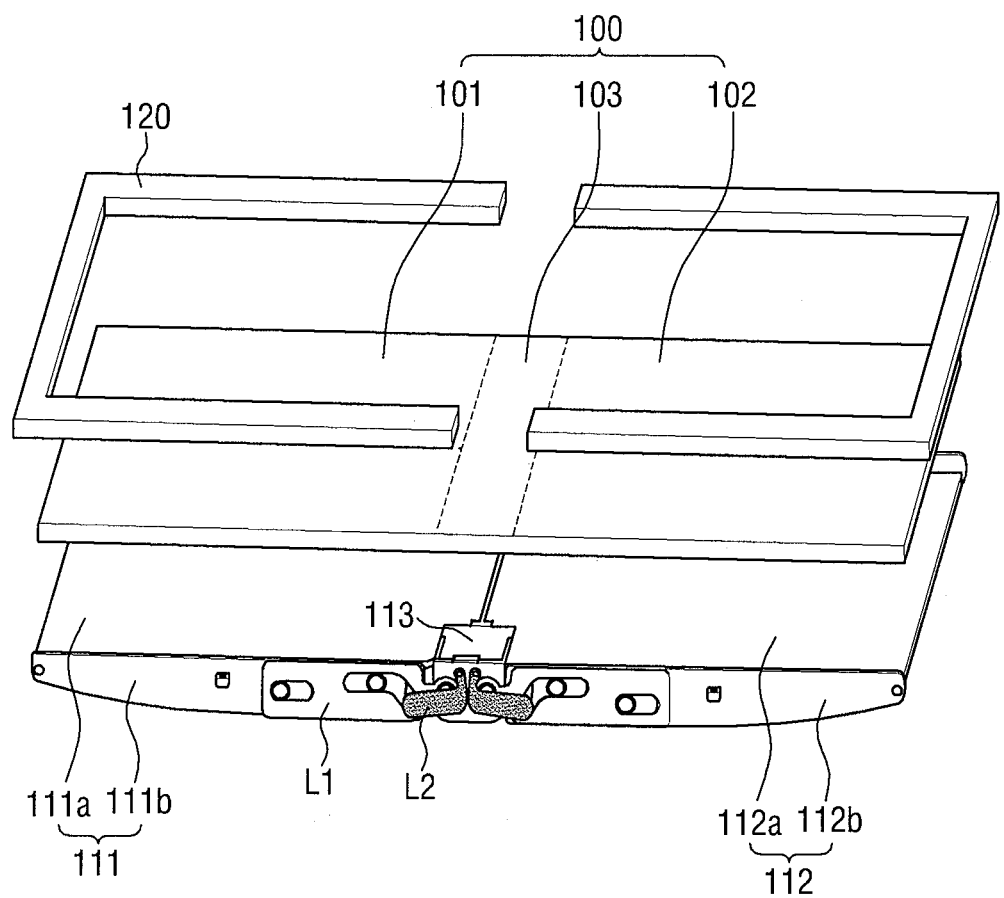
FIG. 1 is an exploded perspective view of a foldable display device according to an embodiment of the present invention.
Figure 1:
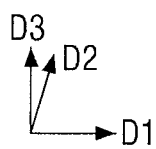
Figure 2:
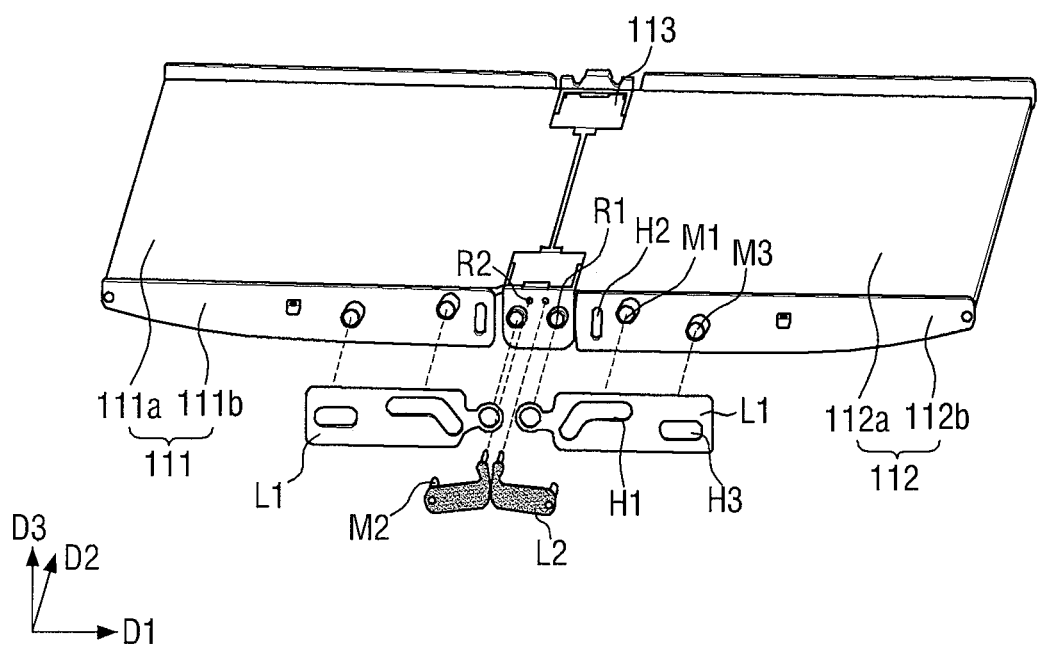
FIG. 2 is an exploded perspective view of a lower case according to an embodiment of the present invention.
Figure 3:
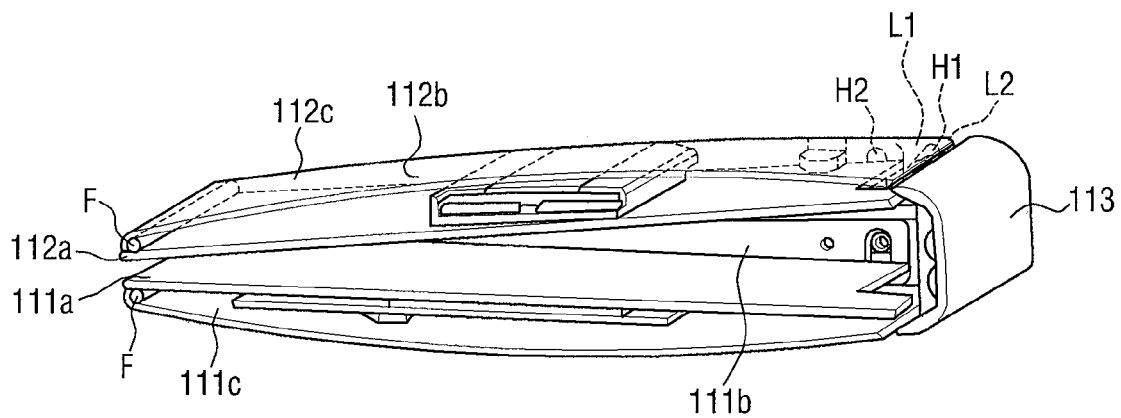
FIG. 3 is a cross-sectional view of the lower case in a folded state according to the embodiment of FIG. 2.
Figure 4:
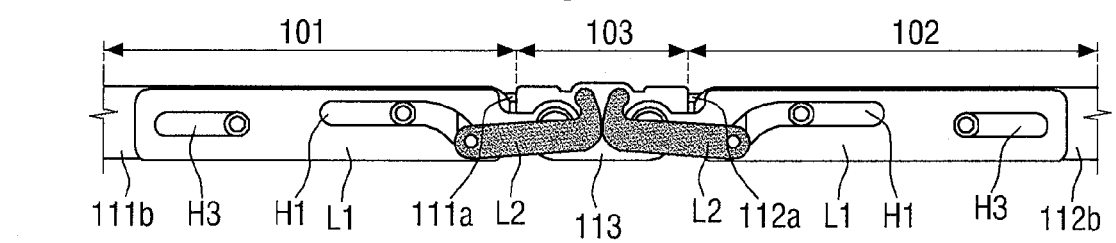
FIGS. 4 and 5 are cross-sectional views of the lower case according to the embodiment of FIG. 2.
Figure 4:
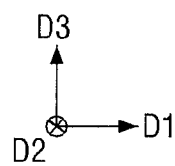
Figure 5:
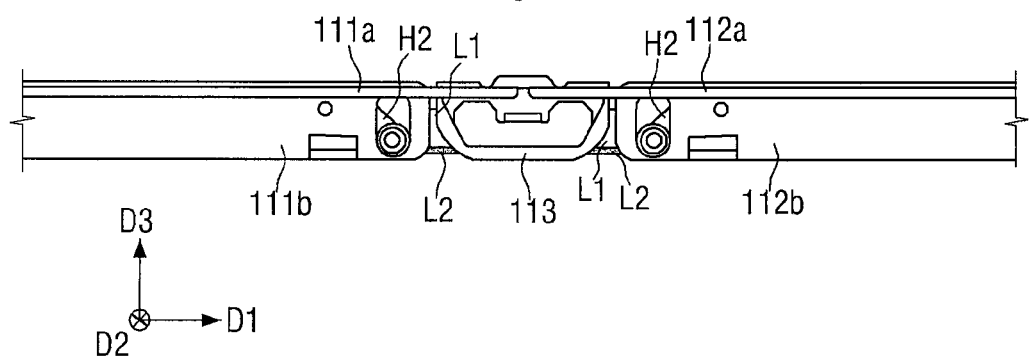
Figure 5:
Figure 6:
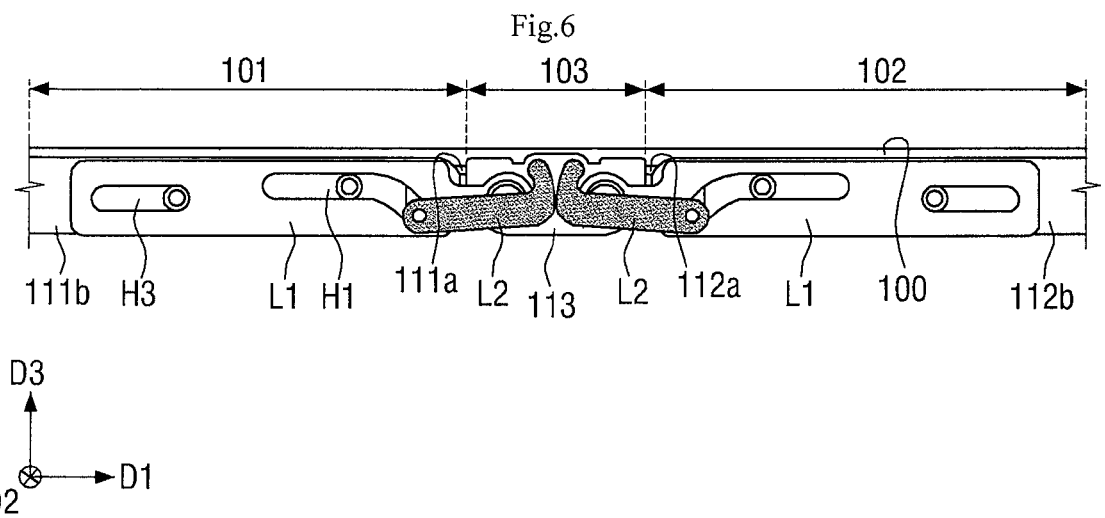
FIGS. 6 through 9 are cross-sectional views illustrating changes experienced by the display panel and the lower case as they are folded.

FIG. 1 is an exploded perspective view of a foldable display device 10 according to an embodiment of the present invention. FIG. 2 is a perspective view of a lower case 110 according to an embodiment of the present invention. FIG. 3 is a cross-sectional view of the lower case 110 in a folded state according to the embodiment of FIG. 2. FIGS. 4 and 5 are cross-sectional views of the lower case 110 according to the embodiment of FIG. 2.

Referring to FIGS. 1 through 5, the foldable display device 10 according to the current embodiment includes a flexible display panel 100, the lower case 110, and an upper case 120.

The flexible display panel 100 is a panel that displays images. The flexible display panel 100 may be a liquid crystal display (LCD) panel, an electrophoretic display panel, an organic light-emitting diode (OLED) panel, a light-emitting diode (LED) panel, an inorganic electroluminescent (EL) display panel, a field emission display (FED) panel, a surface-conduction electron-emitter display (SED) panel, a plasma display panel (PDP), or a cathode ray tube (CRT) panel. Hereinafter, an OLED display device will be described as an example of the foldable display device (e.g., foldable display panel) 10 according to the current embodiment, and an OLED panel will be described as an example of the flexible display panel 100 according to the current embodiment. However, the foldable display device 10 and the display panel 100 of the present invention are not limited to the above examples, and various suitable types of display devices and display panels may also be used.

The flexible display panel 100 may display an image using OLEDs and pixel circuits. In addition, a cover window may be located on a side of the flexible display panel 100 on which an image is displayed. The cover window may have multiple portions and be made of a transparent rigid material that may transmit an image displayed on the flexible display panel 100 without modification, protect the flexible display panel 100 from external impact, and reduce or prevent introduction of foreign matter into the flexible display panel 100. A touch panel, which senses a user's touch motion, may be located between the flexible display panel 100 and the cover window. The flexible display panel 100, the touch panel, and the cover window form a display device module. In the current embodiment, the flexible display panel 100 may be defined as representing the display device module.

The flexible display panel 100 includes a first flat area 101, a second flat area 102, and a bendable area 103 formed between the first flat area 101 and the second flat area 102. Each of the first and second flat areas 101 and 102 may form a flat surface when the foldable display device 10 is folded or unfolded. The bendable area 103 may form a flat surface when the foldable display device 10 is unfolded and may be bent in a circular arc when the foldable display device 10 is folded. The foldable display device 10 may be folded and unfolded from the bendable area 103 of the flexible display panel 100. The first flat area 101, the bendable area 103, and the second flat area 102 may be disposed sequentially along a first direction D1 based on a case where the foldable display device 10 is unfolded. An axis of rotation that enables the foldable display device 10 to be folded may be formed parallel to a second direction D2 perpendicular to the first direction D1. The bendable area 103 of the flexible display panel 100 may be made of a material having a certain degree of flexibility, for example, a flexible film such as a plastic film. The first and second flat areas 101 and 102 may be formed to maintain a flat shape and may be made of a material having a certain degree of hardness. However, the present invention is not limited thereto, and all of the first and second flat areas 101 and 102 and the bendable area 103 may be made of a flexible material.

The flexible display panel 100 may be housed in the lower case 110. The upper case 120 and the lower case 110 located on and under the flexible display panel 100 may be coupled to each other, thereby supporting the flexible display panel 100. The upper case 120 and the lower case 110 may maintain the flexible display panel 100 in a certain shape. That is, when the foldable display device 10 is spread out, the upper case 120 and the lower case 110 may maintain the flexible display panel 100 in a certain shape. When the foldable display device 10 is folded, the upper case 120 and the lower case 110 may maintain the foldable display panel 10 in a certain folded shape.

The upper case 120 may cover edges of the first and second flat areas 101 and 102 and may be coupled to the lower case 110. The upper case 120 may include a gap (e.g., a predetermined gap) in an area that overlaps the bendable area 103, so that the foldable display device 10 may be folded. However, the configuration of the upper case 120 is not limited to the above example.

The lower case 110 includes a hinge part (or a hinge) 113, a first support part (or a first support) 111, and a second support part (or a second support) 112. The hinge part 113 may correspond to the bendable area 103 of the flexible display panel 100. The first and second support parts 111 and 112 may be located on respective sides of the hinge part 113 and correspond to the first and second flat areas 101 and 102, respectively. The first and second support parts 111 and 112 may support the flexible display panel 100 such that the first and second flat areas 101 and 102 may maintain flat surfaces.

The first and second support parts 111 and 112 may respectively include first and second support plates 111a and 112a, first and second sidewalls 111b and 112b, and first and second bottom portions 111c and 112c. The first and second support plates 111a and 112a may support the flexible display panel 100. Respective surfaces of the first and second support plates 111a and 112a, which face the flexible display panel 100, may be flat surfaces. The first and second flat areas 101 and 102 corresponding to the surfaces of the first and second support plates 111a and 112a may respectively be coupled to the surfaces of the first and second support plates 111a and 112a by, e.g., an adhesive. The first and second flat areas 101 and 102 of the flexible display panel 100 may be partially or completely attached to the first and second support plates 111a and 112a by the adhesive. The bendable area 103 not attached to the first and second support parts 111 and 112 may not be directly constrained by the first and second support parts 111 and 112. The first and second bottom portions 111c and 112c may face the other surfaces of the first and second support plates 111a and 112a with a distance (e.g., a predetermined distance) therebetween. Referring to FIG. 3, circuit boards that drive the flexible display panel 100 may be located in spaces formed by the first and second support plates 111a and 112a and the first and second bottom portions 111c and 112c, respectively. The first and second sidewalls 111b and 112b may extend from both sides of the first and second bottom portions 111c and 112c to be perpendicular to the first and second support plates 111a and 112a. The first and second sidewalls 111b and 112b may be coupled to the first and second support plates 111a and 112a. As illustrated in FIG. 3, the first and second support parts 111 and 112 may be coupled to the first and second sidewalls 111b and 112b by fixing members F that penetrate ends of the first and second sidewalls 111b and 112b, but the present invention is not limited thereto. The first and second support parts 111 and 112 may be moved in the same or substantially the same direction as a direction in which the first and second sidewalls 111b and 112b move.

Each of the first and second support parts 111 and 112 may be separated from the hinge part 113 by a distance (e.g., a predetermined distance). Each of the first and second support parts 111 and 112 may be connected to the hinge part 113 not directly but indirectly by a first link L1 and a second link L2. As illustrated in FIGS. 1 and 2, the foldable display device 10 according to the current embodiment may include the first link L1 and the second link L2, which have different radii of rotation. Here, a radius of rotation may denote a distance between an axis of rotation and a particular point, assuming that the moment of inertia of a rotating object and the mass of the rotating object are located at the particular point. That is, the radius of rotation may denote a vertical distance between an axis of rotation and a location at which a rotational force acts. In addition, two first links L1 may be connected to one hinge part 113 in order to connect the first support part 111 and the second support part 112 to the hinge part 113. Here, to facilitate the folding of the foldable display device 10, the hinge part 113 may be formed on both sides along the second direction D2, which is the direction of the axis of rotation. Therefore, two first links L1 may be connected to each of the first support part 111 and the second support part 112 in order to rotate the first support part 111 and the second support part 112. The above description of the first link L1 may apply the same to the second link L2. That is, two second links L2 may be connected to each of the first support part 111 and the second support part 112 in order to control the rotation of the first support part 111 and the second support part 112.

The hinge part 113 may include a first rotation point R1 and a second rotation point R2 at different locations. The first link L1 and the second link L2 may be connected to the first rotation point R1 and the second rotation point R2, respectively. The first rotation point R1 and the second rotation point R2 may be formed in the hinge part 113 at different heights. A virtual line extending from the first rotation point R1 along the first direction D1 may not pass through the second rotation point R2. The first link L1 may rotate about the first rotation point R1 in a clockwise or counterclockwise direction. The second link L2 may rotate about the second rotation point R2 in the clockwise or counterclockwise direction. The first rotation point R1 may be a point where a spindle for providing a rotational force inside the hinge part 113 protrudes. The first link L1 may be coupled to the spindle of the first rotation point R1 and rotated by the rotational force provided by the spindle. On the other hand, the second rotation point R2 may be a point that is coupled to a spindle protruding from an end of the second link L2. The second link L2 may be coupled to a region of the first link L2 and rotated by the rotational force of the first link L1. However, the present invention is not limited thereto. In some embodiments, a spindle different from the one at the first rotation point R1 may be disposed at the second rotation point R2, and the second link L2 may be rotated independently of the first link L1.

The first link L1 may be shaped like a flat plate and extend, on the whole, along the first direction D1. A length of the first link L1 may be smaller than those of the first and second sidewalls 111b and 112b. However, a height of the first link L1 may be substantially equal to those of the first and second sidewalls 111b and 112b. The first link L1 may include a first guide hole (or a first guide opening) H1. The first guide hole H1 may be formed adjacent to an end of the first link L1 that is coupled to the first rotation point R1. At least part of the first guide hole H1 may include a region extending in a horizontal direction. Here, the horizontal direction may be the first direction D1. The first guide hole H1 may be a passage that connects the first link L1 to each of the first and second support parts 111 and 112, and may also be a path along which each of the first and second support parts 111 and 112 is moved in the horizontal direction. For example, each of the first and second sidewalls 111b and 112b of the first and second support parts 111 and 112 may include a moving protrusion M1, which may be coupled to the first guide hole H1. While being inserted into the first guide hole H1, the first moving protrusion M1 may be coupled to a fixing member. The coupling of the first moving protrusion M1 to the fixing member may cause each of the first and second sidewalls 111b and 112b to be coupled to the first link L1. Accordingly, a rotational force, which is provided at the first rotation point R1 to rotate the first link L1, may be transmitted to each of the first and second sidewalls 111b and 112b. The rotational force transmitted to each of the first and second sidewalls 111b and 112b through the first link L1 may rotate a corresponding one of the first and second support parts 111 and 112. The first moving protrusion M1 may be coupled to the fixing member while being inserted into the horizontally extending region of the first guide hole H1 of the first link L1. The first moving protrusion M1 coupled to the fixing member may move along the horizontally extending region of the first guide hole H1. As the first moving protrusion M1 moves in the horizontal direction, each of the first and second support parts 111 and 112 may also move in the horizontal direction.

Each of the first and second sidewalls 111b and 112b may include a second guide hole (or a second guide opening) H2 formed at an end thereof adjacent to the hinge part 113. The second guide hole H2 may extend along a vertical direction. Here, the vertical direction may be a third direction D3. A length of the second guide hole H2 may be smaller than the heights of the first and second sidewalls 111b and 112b. In a state where the first link L1 is coupled to each of the first and second sidewalls 111b and 112b, the first guide hole H1 of the first link L1 and the second guide hole H2 may partially overlap each other. The second link L2 may have a first end connected to the second rotation point R2 and a second end connected to the second guide hole H2. The second end of the second link L2 may include a second moving protrusion M2, and the second moving protrusion M2 may be coupled to a fixing member while being inserted into both the first guide hole H1 and the second guide hole H2.

The coupling of the second moving protrusion M2 of the second link L2 to the fixing member may cause the second end of the second link L2 to be coupled to the first link L1 and each of the first and second sidewalls 111b and 112b. Therefore, the rotational force of the first link L1 and each of the first and second sidewalls 111b and 112b may be transmitted to the second link L2, and the second link L2 may be rotated about the second rotation point R2.

The movement of the second moving protrusion M2 may be limited to an overlapping region between the first link L1 and the second link L2 connected to the second moving protrusion M2. The rotational motion of each of the first and second support parts 111 and 112 may be limited by the first link L1 connected to each of the first and second support parts 111 and 112. However, each of the first and second support parts 111 and 112 may move freely in the horizontal direction due to the first guide hole H1 of the first link L1. However, because the second link L2 is connected to both the second guide hole H2 of each vertically extending sidewall 111b or 112b and the first guide hole H1, it may prevent or substantially prevent each of the first and second support parts 111 and 112 from moving in the horizontal direction toward the hinge part 113. That is, in a state where the foldable display device 10 is spread out, the horizontal movement of each of the first and second support parts 111 and 112 toward the hinge part 113 may be hindered by the second link L2. In addition, in a state where the foldable display device 10 is spread out, the second link L2 may prevent or substantially prevent the foldable display device 10 from being folded in a direction opposite to a direction in which an image is displayed.

Referring to FIG. 4, the second link L2 may have a bent shape. A bent region of the second link L2 connected to the first sidewall 111b and a bent region of the second link L2 connected to the second sidewall 112b may contact each other. The second links L2 whose bent regions contact each other may support each other. Accordingly, the second links L2 may prevent or substantially prevent the first and second support parts 111 and 112 from rotating in a downward direction opposite to the direction in which an image is displayed. The second rotation point R2 may be formed at a higher location than the first rotation point R1 such that the second link L2 may have a bent shape and that the second link L2 may be rotated to a higher location. However, the present invention is not limited thereto.

The first link L1 may further include a third guide hole H3 extending in the horizontal direction. The third guide hole H3 may be formed farther from the hinge part 113 than the first guide hole H1. The third guide hole H3 may be at the same or substantially the same horizontal location as the first guide hole H1, but the present invention is not limited thereto. Each of the first and second sidewalls 111b and 112b may further include a third moving protrusion M3, which is inserted into the third guide hole H3. The third moving protrusion M3 inserted into the third guide hole H3 may be coupled to a fixing member, thereby more securely coupling the first link L1 to each of the first and second sidewalls 111b and 112b. The third moving protrusion M3 may move horizontally within a region formed by the third guide hole H3. Therefore, the third guide hole H3 may limit the range of horizontal movement of each of the first and second support parts 111 and 112.

In a state where the foldable display device 10 according to the current embodiment is unfolded, part of end regions of the first support plate 111a and the second support plate 112a may overlap the hinge part 113. However, in a state where the foldable display device 10 is folded, the end regions of the first support plate 111a and the second support plate 112a may not overlap the hinge part 113. As described above, in some embodiments, the first support part 111 and the second support part 112 may move horizontally within a limited range. Therefore, as illustrated in FIG. 3, the lower case 110 can be folded with the first and second support plates 111a and 112a separated from the hinge part 113 by a distance (e.g., a predetermined distance). A space formed by the first and second support plates 111a and 112a and the hinge part 113 may be a space in which the bendable area 103 of the flexible display panel 100 may be bent. That is, the lower case 110 according to the current embodiment may provide a bending space that may minimize or reduce stress generated in the bendable area 103 when the flexible display panel 100 is folded. The relationship between the display panel 100 and the lower case 110 will now be described in greater detail with reference to FIGS. 6 through 9.

FIGS. 6 through 9 are cross-sectional views illustrating changes experienced by the display panel 100 and the lower case 110 as they are folded.

Referring to FIGS. 6 through 9, the flexible display panel 100 may be placed on the lower case 110. The first and second flat areas 101 and 102 of the flexible display panel 100 may be coupled to the surfaces of the first and second support plates 111a and 112b by an adhesive layer. In a state where the foldable display device 10 is unfolded, the bendable area 103 may overlap the hinge part 113 but may not be coupled to a top surface of the hinge part 113.

The hinge part 113 may provide at least one of the first support part 111 and the second support part 112 with a rotational force that folds the flexible display panel 100 such that different areas of a surface of the flexible display panel 100 on which an image is displayed may face each other. The hinge part 113 may provide the rotational force to at least one first link L1 connected to each of the first support part 111 and the second support part 112, thereby rotating the first link L1 about the first rotation point R1. Hereinafter, a case where the first link L1 connected to the second support part 112 is rotated in the counterclockwise direction will be described as an example, but the current embodiment is not limited to this case.

Figure 7:
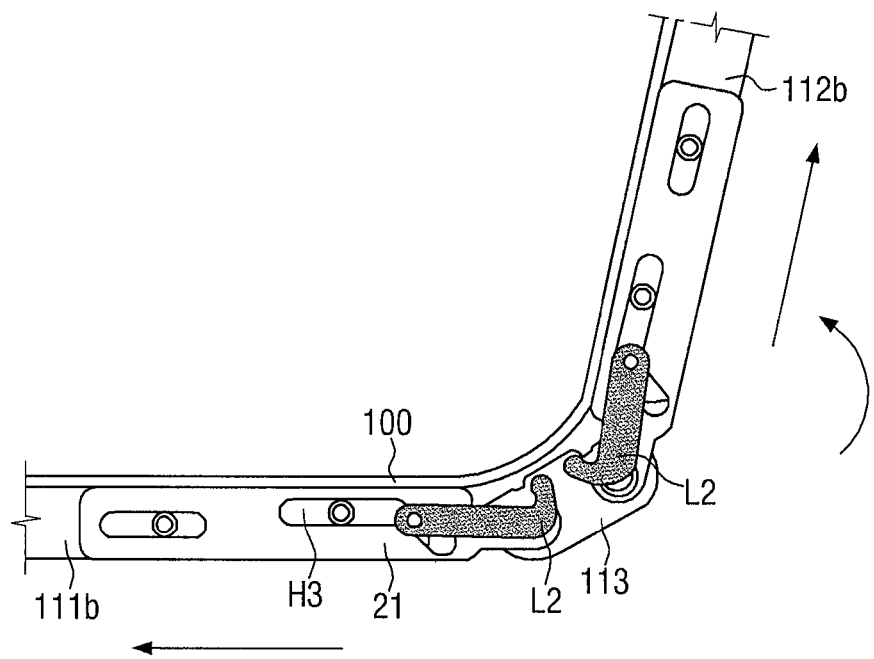
Figure 8:
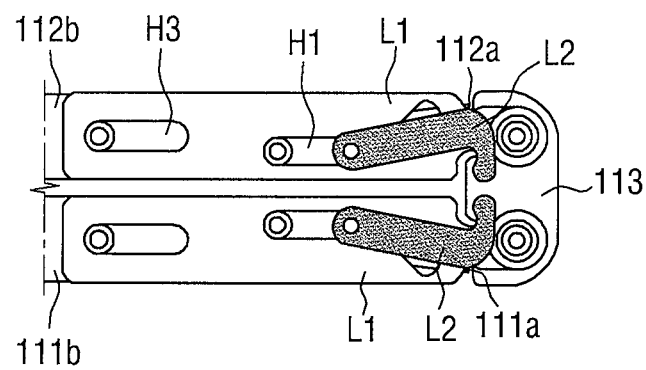
Figure 9:
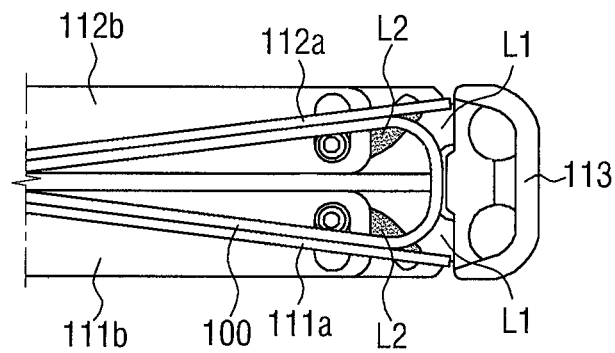

Referring to FIG. 7, as the first link L1 rotates in the counterclockwise direction, the second support part 112 may also rotate in the counterclockwise direction. As the lower case 110 is folded in this way, a compressive force may be generated in the flexible display panel 100. In response to this compressive force, stress may be generated in the flexible display panel 100 as a repulsive force to maintain the existing shape. The stress may act in a direction that would move the flexible display panel 100 out of the lower case 110. That is, stress acting horizontally toward the outside of the display panel 100 may be generated in the first flat area 101 and the second flat area 102 of the flexible display panel 100. Stress acting from the hinge part 113 toward the first support part 111 may be generated in the first flat area 101 of the flexible display panel 100, and stress acting from the hinge part 113 toward the second support part 112 may be generated in the second flat area 102 of the flexible display panel 100. This stress may horizontally move the first support part 111 coupled to the first flat area 101 in a direction away from the hinge part 113 and horizontally move the second support part 112 coupled to the second flat area 102 in a direction away from the hinge part 113. The first support part 111 may move away from the hinge part 113 as it is horizontally moved along the first guide hole H1 and the third guide hole H3 of the first link L1 connected thereto. The second support part 112 may move away from the hinge part 113 as it is horizontally moved along the first guide hole H1 and the third guide hole H3 of the first link L1 connected thereto. As the first support part 111 and the second support part 112 move, the flexible display panel 100 may be folded. Here, the bendable area 103 of the flexible display panel 100 may be bent in a gentler (e.g., a greater or larger) curve, thereby reducing or minimizing the stress that may be generated in the bendable area 103. The distance travelled by which each of the first support part 111 and the second support part 112 may vary according to lengths of the first guide hole H1 and the third guide hole H3 and a length of the second link L2.

In addition, the second link L2 having a bent shape may provide a space that enables the flexible display panel 100 to be folded. The second moving protrusion M2 may be located in a lower part of the second guide hole H2 in a state where the foldable display device 10 is unfolded but may be located in an upper part of the second guide hole H2 in a state where the foldable display device 10 is folded. This change in the location of the second moving protrusion M2 of the second link L2 may cause the hinge part 113 to form a certain angle with the first support plate 111a and the second support plate 112a, which are separated from each other by a certain distance. The distance between the first support plate 111a and the second support plate 112a may increase as the distance to the hinge part 113 decreases and may decrease as the distance from the hinge part 113 increases. In an area adjacent to the hinge part 113, a sufficient space that enables the bendable area 103 to bend without excessive stress may be secured. The lower case 110 according to the current embodiment may provide sufficient space for the bending of the bendable area 103, thereby reducing or preventing the generation of excessive stress.

Also, the horizontal movement of the flexible display panel 100 by the above-described compressive force may cause the bendable area 103 to be separated from the hinge part 113 by a certain distance. That is, because a certain distance may be secured between the bendable area 103 and the hinge part 113, the flexible display panel 100 and the hinge part 113 may not interfere with each other. Accordingly, the damage to the flexible display panel 100 by the hinge part 113 may be reduced or prevented.

In addition, the space secured between the hinge part 113 and the flexible display panel 100 allows components used for folding and unfolding (e.g., efficient folding and unfolding) to be added to the hinge part 113. In an example, the hinge part 113 according to embodiments of the present invention may include a free-stop hinge module that may maintain a preset angle. Therefore, the flexible display panel 100 may maintain the folded and unfolded states and return to the original state after being deformed.

The first guide hole H1 of the first link L1 according to the current embodiment may further include a region extending at an angle (e.g., a predetermined angle) from the horizontally extending region. For example, the first guide hole H1 may include a region that extends from an end of the horizontally extending region toward the hinge part 113 and extends downward toward a lower part of the foldable display device 10. The downwardly extending region may slope such that the angle of inclination of a tangent line increases in a circular arc. However, the present invention is not limited thereto, and the downwardly extending region may also slope downward with a constant angle. In a state where the foldable display device 10 is unfolded, the second moving protrusion M2 of the second link L2 may be located in the downwardly extending region. To move the second moving protrusion M2 to the upper part of the second guide hole H2, the horizontal movement of each of the first and second sidewalls 111b and 112b may be needed. That is, after each of the first and second sidewalls 111b and 112b is moved a certain distance in the horizontal direction, the second moving protrusion M2 of the second link L2 may be completely moved to the upper part of the second guide hole H2. In addition, after the second moving protrusion M2 is moved to the upper part of the second guide hole H2, each of the first and second sidewalls 111b and 112b may further be moved horizontally in accordance with the rotation of the second link L2 and the first link L1. The second moving protrusion M2 of the second link L2 located in the downwardly sloping first guide hole H1 may delay the rotation of the second link L2 for a certain period of time and prevent or substantially prevent abrupt folding of the foldable display device 10. The generation of stress in the flexible display panel 100 due to the abrupt folding of the display device 10 and the initial interference that causes the flexible display panel 100 and the hinge part 113 to instantaneously contact each other may be reduced or prevented. That is, the durability of the foldable display device 10 according to the current embodiment may be improved (e.g., increased).

Embodiments of the present invention provide at least one of the following features.

It is possible to reduce or prevent the damage to a flexible display panel by reducing stress of the flexible display panel. In addition, it is possible to increase durability of a foldable display device.

However, the effects of the present invention are not restricted to the one set forth herein. The above and other effects of the present invention will become more apparent to one of daily skill in the art to which the present invention pertains by referencing the claims.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "lower" and "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Although the exemplary embodiments of the present invention have been disclosed for illustrative purposes, the embodiments are only exemplary, but do not limit the present invention. Those skilled in the art will appreciate that various suitable modifications and applications are possible, without departing from the scope and spirit of the invention as disclosed in the accompanying claims. For example, each element specified in embodiments of the present invention may be variously modified and implemented. Further, differences related to such modifications and applications should be interpreted as being included in the scope of the present invention defined by the accompanying claims, and equivalents thereof.

What is claimed is:

1. A foldable display device comprising:
a flexible display panel comprising a bendable area and flat areas on both sides of the bendable area; and
a lower case housing the flexible display panel and comprising:
a hinge corresponding to the bendable area and comprising a first rotation point connected to a first link having a first radius of rotation and a second rotation point connected to a second link having a second radius of rotation, the second radius of rotation being different from the first radius of rotation; and supports on both sides of the hinge and corresponding to the flat areas, wherein the first link has an end connected to the first rotation point and a first guide opening connected to each of the supports, and the second link has a first end connected to the second rotation point and a second end engaging the first guide opening.

2. The foldable display device of claim 1,
wherein each of the supports comprises a support plate configured to support the flexible display panel, a bottom portion opposite the support plate, and sidewalls extending from both sides of the bottom portion and perpendicular to the support plate, and
wherein each of the sidewalls comprises a second guide opening extending in a different direction from the first guide opening, and the second end of the second link engages the second guide opening.

3. The foldable display device of claim 2, wherein each of the sidewalls comprises a first moving protrusion configured to move along the first guide opening, and the second end of the second link comprises a second moving protrusion configured to move along the first guide opening and the second guide opening.

4. The foldable display device of claim 3, wherein at least part of the first guide opening comprises a region extending in a first direction, and the second guide opening extends in a second direction orthogonal to the first direction.

5. The foldable display device of claim 4, wherein the first guide opening further comprises a region sloping from an end of the region extending in the first direction toward a lower part of the hinge.

6. The foldable display device of claim 1,
wherein each of the supports comprises a support plate configured to support the flexible display panel, a bottom portion opposite the support plate, and sidewalls extending from both sides of the bottom portion and perpendicular to the support plate, and
wherein each of the sidewalls comprises a second guide opening extending in a different direction from the first guide opening, the first link comprises a third guide opening extending in a direction perpendicular to the second guide opening, and the second end of the second link engages the second guide opening.

7. The foldable display device of claim 6, wherein the first guide opening is closer to the hinge than the third guide opening.

8. The foldable display device of claim 1, wherein each of the supports comprises a support plate configured to support the flexible display panel, a bottom surface opposite the support plate, and sidewalls extending from both sides of a bottom portion and perpendicular to the support plate, wherein the first link extends in the same direction as the sidewalls, and a height of the first link is substantially equal to those of the sidewalls.

9. The foldable display device of claim 8, wherein the second link has a bent shape, and a height of the second rotation point along the second direction from a bottom of the hinge is greater than that of the first rotation point.

10. The foldable display device of claim 1, wherein the hinge comprises a spindle configured to provide a rotational force to at least one of the first rotation point and the second rotation point, and an upper case coupled to the lower case to maintain a shape of the flexible display panel.

11. The foldable display device of claim 1, wherein a radius of rotation of the first rotation point is greater than that of the second rotation point.

12. A foldable display device comprising:
a flexible display panel comprising a bendable area and flat areas on both sides of the bendable area;
supports under the flexible display panel and corresponding to the flat areas, the supports being configured to support the flexible display panel; and
a hinge between the supports and configured to rotate each of the supports using a first link connected to a first rotation point and a second link connected to a second rotation point, the second rotation point being different from the first rotation point,
wherein each of the supports comprises a support plate contacting the flexible display panel and sidewalls perpendicular to the support plate, and
wherein the first link is connected to each of the sidewalls using a first guide opening comprising a region extending in a first direction in at least part thereof, each of the sidewalls comprises a second guide opening extending in a second direction orthogonal to the first direction, and the second link is configured to move along the first guide opening and the second guide opening.

13. The foldable display device of claim 12, wherein each of the sidewalls comprises a first moving protrusion configured to move along the first guide opening, and a second end of the second link comprises a second moving protrusion configured to move along the first guide opening and the second guide opening.

14. The foldable display device of claim 12, wherein the first link further comprises a third guide opening extending in the first direction, and each of the sidewalls further comprises a third moving protrusion configured to move along the third guide opening.

15. The foldable display device of claim 14, wherein the first guide opening is closer to the hinge than the third guide opening.

16. The foldable display device of claim 12, wherein the first link extends in the same direction as the sidewalls, and a height of the first link is substantially equal to those of the sidewalls.

17. The foldable display device of claim 16, wherein the second link has a bent shape, and a height of the second rotation point along the second direction from a bottom of the hinge is greater than that of the first rotation point.

18. The foldable display device of claim 12, wherein the hinge comprises a spindle configured to provide a rotational force to at least one of the first rotation point and the second rotation point, and an upper case coupled to a lower case to maintain a shape of the flexible display panel.

19. The foldable display device of claim 12, wherein a radius of rotation of the first rotation point is different from that of the second rotation point.

20. The foldable display device of claim 19, wherein the radius of rotation of the first rotation point is greater than that of the second rotation point.

* * * * *